United States Patent [19]
Nishihara

[11] Patent Number: 5,854,502
[45] Date of Patent: Dec. 29, 1998

[54] NON-VOLATILE MEMORY CELL HAVING FLOATING GATE ELECTRODE AND REDUCED BIRD'S BEAK PORTIONS

[75] Inventor: Toshiyuki Nishihara, Kanagawa, Japan

[73] Assignee: Sony Corporation, Japan

[21] Appl. No.: 897,528

[22] Filed: Jul. 21, 1997

Related U.S. Application Data

[63] Continuation of Ser. No. 544,728, Oct. 18, 1995, abandoned.

[30] Foreign Application Priority Data

Oct. 31, 1994 [JP] Japan .................................. 6-267733

[51] Int. Cl.$^6$ .................................................. H07L 29/788
[52] U.S. Cl. ........................................... 257/321; 257/316
[58] Field of Search .................... 257/315, 316, 257/317, 318, 319, 320, 321; 438/257, 259, 260, 261, 262

[56] References Cited

U.S. PATENT DOCUMENTS

| | | |
|---|---|---|
| 5,293,331 | 3/1994 | Hart et al. ................................ 257/321 |
| 5,371,393 | 12/1994 | Chang et al. . | 
| 5,379,253 | 1/1995 | Bergemont ............................... 365/185 |

*Primary Examiner*—David B. Hardy
*Attorney, Agent, or Firm*—Ronald P. Kananen

[57] ABSTRACT

A semiconductor non-volatile memory cell is structured so that a gate insulating film between a semiconductor substrate and a floating gate is formed thinner at its central portion with respect to the direction of channel width and thicker at its edges. As a result of this structure, fluctuations in the coupling ratio caused by a "bird's beak" portion are suppressed and variations in the writing and erasing characteristics are reduced.

10 Claims, 5 Drawing Sheets

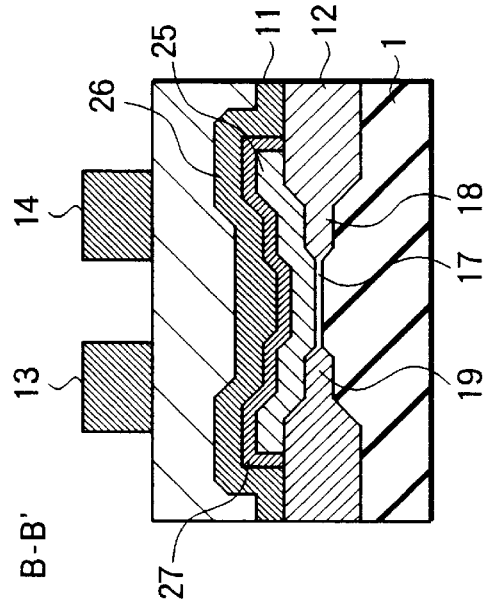
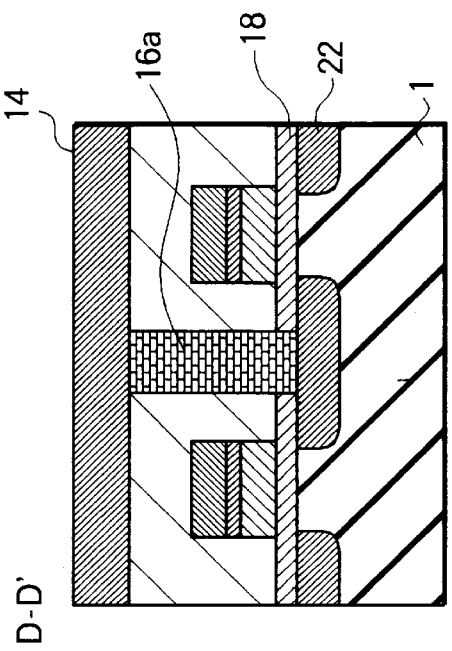
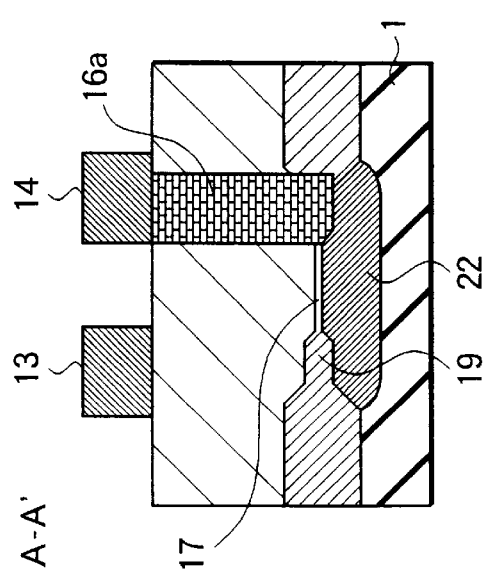
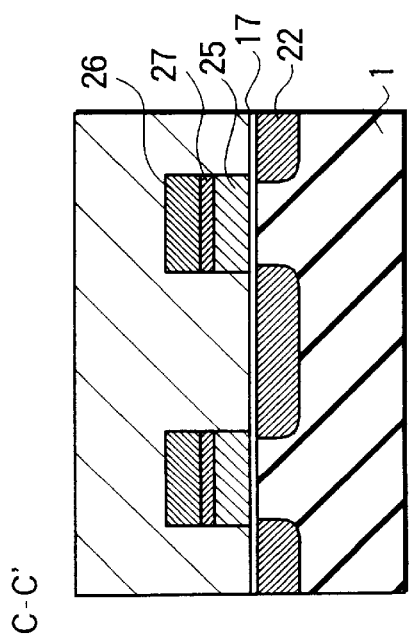

NON-VOLATILE MEMORY CELL HAVING FLOATING GATE ELECTRODE AND REDUCED BIRD'S BEAK PORTIONS

This application is a continuation of application Ser. No. 08/544,728 filed Oct. 18, 1995 now abandoned.

BACKGROUND OF THE INVENTION

1. Field of the Invention

The present invention relates to the structure of a non-volatile memory cell having a floating gate electrode, and more particularly relates to the structure of the insulating film between the floating gate and the semiconductor substrate.

2. Description of the Related Art

The recent spread and development of portable data terminals has led to a growing need for large capacity flash memories as external storages.

The memory transistors of flash memories, however, suffer from the problems of fluctuations in the coupling ratio caused by the undesired spread of the width of the oxide film, commonly known as the "bird's beak" phenomenon, and variations in the writing and erasing characteristics.

SUMMARY OF THE INVENTION

The present invention was made in consideration of this situation and has one of its object to provide a non-volatile memory cell which can suppress the fluctuations in the coupling ratio and can prevent variations in the writing and erasing characteristics.

To achieve this object, according to a first aspect of the present invention, there is provided an electrically programmable, insulated gate field effect transistor memory cell having a source region and a drain region spaced apart in a substrate which defines a channel region, a floating gate member insulated from and disposed above the channel region, and a control gate member insulated from and disposed above the floating gate member, wherein an insulating layer between the floating gate member and the substrate is thicker at the edges of the floating gate member than at the central portion of the floating gate member.

According to another aspect of the present invention, there is provided an electrically programmable memory array comprising an insulated gate field effect transistor memory cell having a source region and a drain region spaced apart in a substrate which defines a channel region, a floating gate member insulated from and disposed above the channel region, and a control gate member insulated from and disposed above the floating gate member; a word line connected to the control gate; a source line connected to the source region perpendicular to the word line; and a bit line connected to the drain region perpendicular to the word line; wherein the insulating layer between the floating gate member and the substrate is thicker at the edges of the floating gate member than at the central portion of the floating gate member.

Preferably, an electric charge is injected to the floating gate through a thinner region of the insulating layer.

Preferably, the source and drain regions are formed using a word line and field oxide as masks.

BRIEF DESCRIPTION OF THE DRAWINGS

These and other objects and features of the present invention will become clearer from the following description of the preferred embodiments given with reference to the attached drawings, in which:

FIGS. 7A to 7D are cross-sectional views of the portions A–A', B–B', C–C', and D–D' in FIG. 6.

DESCRIPTION OF THE PREFERRED EMBODIMENTS

Before describing the preferred embodiments of the present invention, the related art will be explained in further detail by way of reference.

Figure 1:
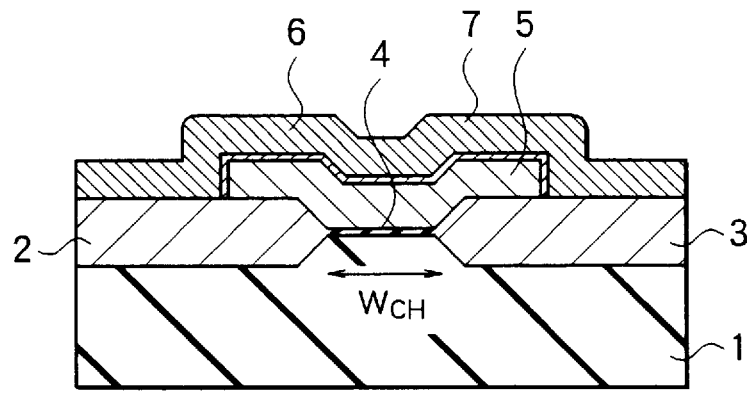
FIG. 1 is a cross-sectional view of a non-volatile memory cell of the related art in the direction of channel width.

The memory transistors of flash memories have a cross-sectional structure in the direction of channel width as shown in FIG. 1.

In FIG. 1, 1 represents a semiconductor substrate, 2 and 3 represent field oxide films, 4 represents a gate oxide field, 5 represents a floating gate, 6 represents a word line (control gate), 7 represents an interlayer insulating film, and $W_{CH}$ represents the channel width.

The memory transistor is comprised of a substrate 1 on which is formed by a normal LOCOS method the field oxide films 2 and 3 to a thickness of for example 4000 Å (Angstroms: $10^{-8}$cm). The channel width $W_{CH}$ is determined by these field oxide films 2 and 3.

In a memory transistor having such a configuration, a charge is injected into the floating gate 5 by applying a high voltage to the word line 6 so as to apply a strong electric field to the gate insulating film 4 which is formed so as to face the bottom layer from the floating gate 5.

When the charge is not yet injected in the floating gate 5, if a voltage $V_w$ is applied to the word line 6, the voltage $V_1$ applied to the gate insulating film 4 is given by the following equation:

$$V_1 = V_w \cdot C2/(C1+C2) \tag{1}$$

Where, C1 is the capacitance between the floating gate 5 and the substrate 1, and C2 is the capacitance between the floating gate 5 and the word line 6.

In general, C2/(C1+C2) is referred to as the "coupling ratio".

When the channel width $W_{CH}$ is determined by the field oxide films 2 and 3 as explained above, however, differences occur between the design dimensions and the final dimensions due to the "bird's beak" portion formed by the LOCOS method. These differences are extremely great compared with those in the ordinary resist patterning.

That is, the variations in the channel width $W_{CH}$ are comprised of the variations at the time of ordinary patterning plus the variations due to the "bird's beak" portion.

The variations in the channel width $W_{CH}$ become variations in the capacitance C1 between the floating gate 5 and the substrate 1 and cause the coupling ratio to vary.

Accordingly, in the above memory transistor, the voltage potential applied to the gate oxide film 4 also ends up fluctuating and large fluctuations end up occurring in the charge injected.

This problem is particularly remarkable when transferring a charge between the channel and floating gate by Fowler-Nordheim (FN) tunneling effect.

As a result, there was the problem that the threshold value of the memory transistor at the time of erasing and writing became unstable.

Further, as a non-volatile memory cell, there has been proposed an isolated source type memory cell wherein the source lines are isolated for each corresponding bit line. In this cell, it becomes possible to write by injecting a charge using the entire surface of the channel and possible to improve the reliability of the gate oxide film. (For example, see Nikkei Microdevices, May 1992, pp. 45 to 50.)

Figure 2:
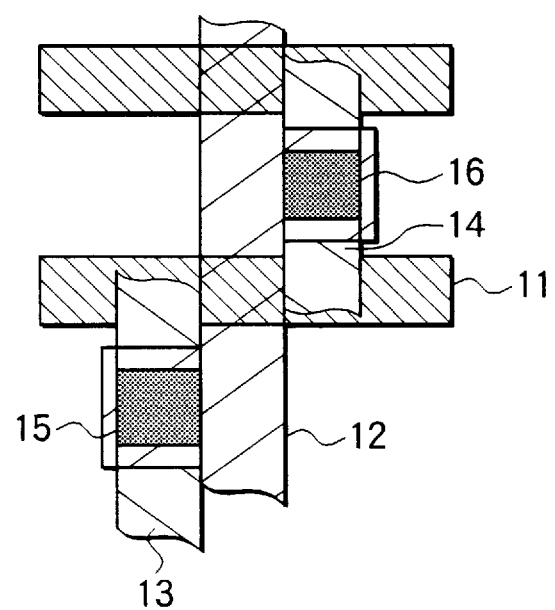
FIG. 2 is a plan view of the patterns for forming an isolated-source type memory cell.

FIG. 2 is a view of the layout of an example of the configuration of an isolated-source type memory cell.

In FIG. 2, 11 denotes a word line, 12 denotes a diffusion layer, 13 denotes a bit line, 14 denotes a source line, 15 denotes a contact to the bit line 13, and 16 denotes a contact to the source line 14. In this memory cell, the bit line 13 and the source line 14 are arranged in a direction perpendicular to the word line 11.

Figure 3:
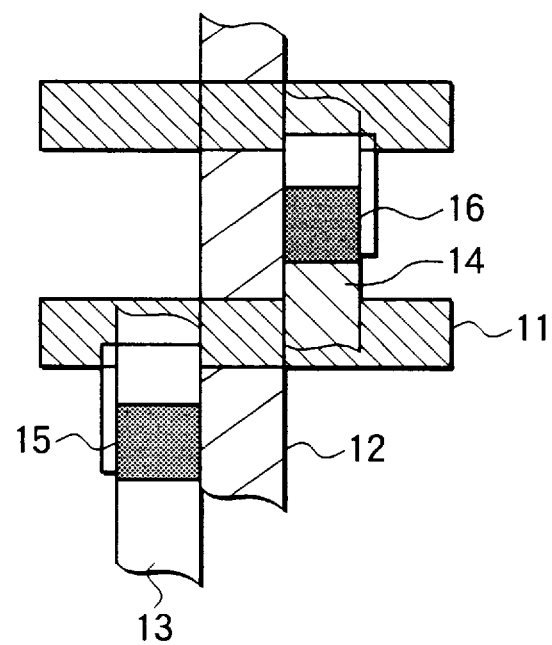
FIG. 3 is a plan view of the case where the patterns are misaligned in FIG. 2.

In this memory cell, however, there was the problem that the gate width of the memory transistor ended up changing as shown in FIG. 3 due to misalignment of the patterns of the word line 11 and the diffusion layer 12.

Due to this, the coupling ratio fluctuated and the writing and erasing characteristics ended up widely varying as well.

Explaining the present invention next, the semiconductor non-volatile memory cell of the present invention is structured so that the gate insulating film of the memory transistor is made thinner at the central portion with respect to the direction of channel width and thicker at its two edges. By making the gate insulating film near the field insulating film selectively thicker than the gate insulating film of the central portion, the fluctuations in the coupling ratio caused by the "bird beak" are greatly reduced.

In the semiconductor non-volatile memory cell of the present invention, the charge is drained from or injected to the floating gate through the thinner portion of the insulating film at the center.

The memory cell is structured so that the source lines are isolated for each corresponding bit line. Data is written by injecting a charge to the floating gate by FN tunneling using the entire channel surface.

Figure 4:
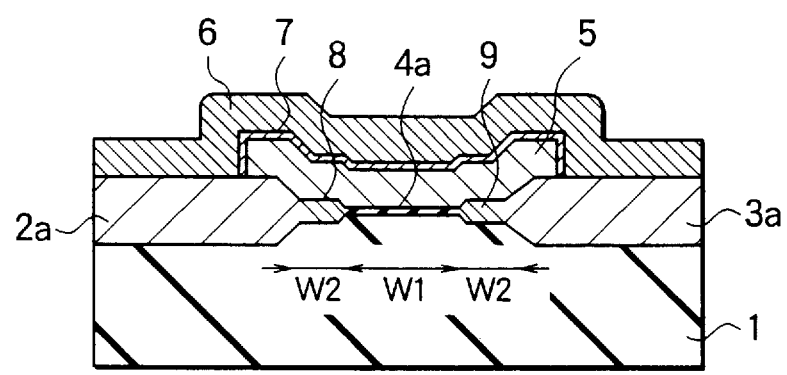
FIG. 4 is a cross-sectional view of a non-volatile memory cell according to an embodiment of the present invention in the direction of channel width.

FIG. 4 is a view of a semiconductor non-volatile memory cell according to a first embodiment of the present invention. It is a cross-sectional view of a memory transistor in the direction of channel width. Portions of the configuration the same as in the view of the related art are shown by the same reference numerals.

That is, 1 denotes a semiconductor substrate, 2a and 3a denote field oxide films, 4a denotes a first gate oxide film, 5 denotes a floating gate, 6 denotes a word line (control gate), 7 denotes an interlayer insulating film, and 8 and 9 denote second gate oxide films.

This memory transistor is structured so that a first gate insulating film 4a of a thickness of 8 nm is formed so that the gate oxide film becomes thinner at the central portion in the direction of channel width and so that second gate insulating films 8 and 9 of thicknesses of 40 nm are formed so that it becomes thicker at the two edges. The charge is drained from and injected into the floating gate 5 through the thin first insulating film 4a at the center.

Due to this configuration, it is possible to suppress fluctuations in the coupling ratio caused by the "bird's beak" portion and possible to ensure stable writing and erasing characteristics.

The reasons for this will be explained below.

In this configuration, when the width of the first gate insulating film 4a positioned at the center is W1 and the widths of the second gate insulating films 8 and 9 are both W2, the capacitance C1 between the floating gate 5 and the substrate 1 is given by the following equation:

$$C1 = (L \cdot W1 \cdot \epsilon oX/8E-3) + (L \cdot 2W2 \cdot \epsilon oX4E-2) \quad (2)$$

Where, L is the gate length of the memory transistor and $\epsilon oX$ is the dielectric ratio of the gate insulating film.

Here, if just a change $\Delta W$ occurs in the "bird's beak" at one side, the change $\Delta C1$ in the capacitance C1 between the floating gate 5 and the substrate 1 is given by the following equation:

$$\Delta C1 = L \cdot 2\Delta W \cdot \epsilon oX/(4 \times 10^{-2}) \quad (3)$$

Accordingly, the rate of change is given by the following equation:

$$\Delta C1/C1 = 2\Delta W/(5W1+2W2) \quad (4)$$

On the other hand, in the memory transistor shown in FIG. 1, a channel is formed by just the gate oxide film 4 of the 8 nm thickness, so when the same type of estimate is made as above, the capacitance C1' between the floating gate 5 and the substrate 1 is given by the following equation:

$$C1' = L \cdot W1 \cdot \epsilon oX/(8 \times 10^{-3}) \quad (5)$$

Further, the change $\Delta C1'$ of the capacitance C1', becomes:

$$\Delta C1' = L \cdot 2\Delta W \cdot \epsilon oX/(8 \times 10^{31\ 3}) \quad (6)$$

Accordingly, the rate of change becomes as follows:

$$\Delta C1'/C1' = 2\Delta W/W1 \quad (7)$$

As will be understood from equations (4) and (7), use of the present invention enables suppression of the fluctuations in the coupling ratio caused by the "bird's beak" portion and enables stable writing and erasing characteristics.

Next, the process of production of the memory transistor of FIG. 4 will be explained with reference to FIGS. 5A to 5E.

Figure 5A:
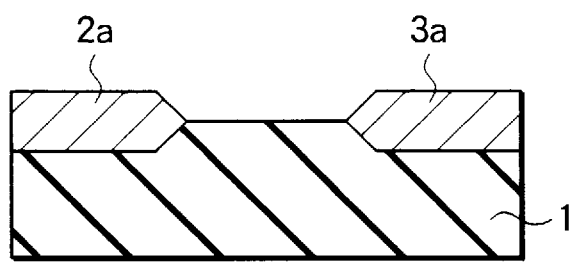
FIGS. 5A to 5E are views of the process of production of the non-volatile memory cell shown in FIG. 4.

As shown in FIG. 5A, first, the field oxide films 2a and 3a are formed on the substrate 1 by the LOCOS method.

Figure 5B:
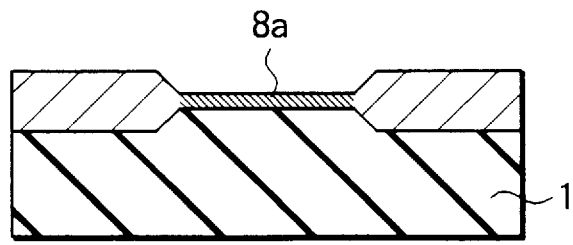

Next, as shown in FIG. 5B, the entire surface is subjected to heat oxidation treatment to grow a silicon oxide film 8a to 36 nm.

Figure 5C:
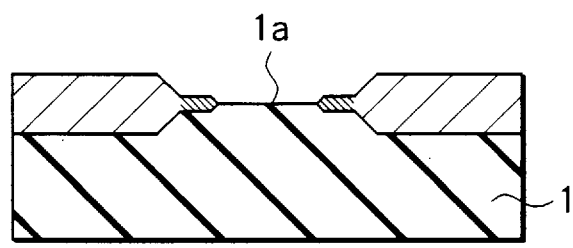

Next, as shown in FIG. 5C, the oxide film at the center of the channel is selectively stripped by hydrofluoric acid using a mask to expose the silicon substrate surface 1a.

Figure 5D:
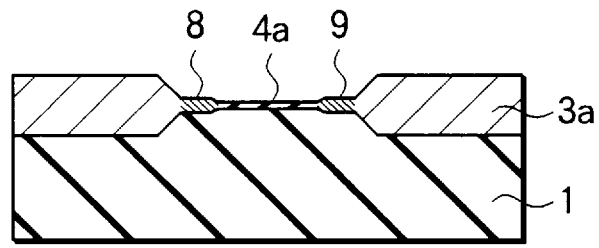

Next, as shown in FIG. 5D, a heat oxide film is grown to 8 nm over the entire surface once again. Due to this, the thick second oxide films 8 and 9 of 40 nm thickness are formed at the edges of the channel and the thin first oxide film 4 of 8 nm thickness is formed at the center of the channel.

Figure 5E:
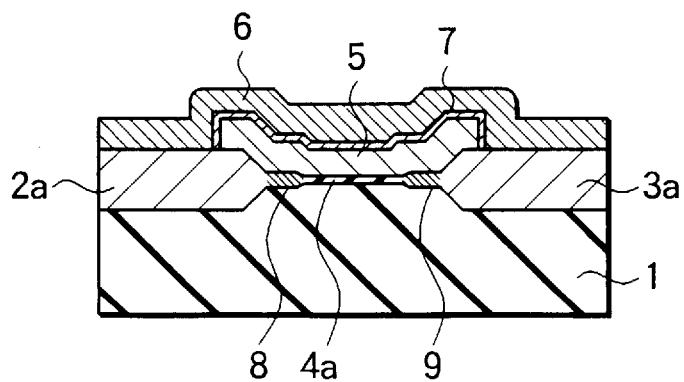

As shown in FIG. 5E, next, a floating gate 5 made of polycrystalline silicon, an interlayer insulating film 7 comprised of a stacked film of $SiO_2$ and SiN, and a control gate (word line) 6 comprised of polycrystalline silicon are successively formed.

In this way, in the memory transistor according to this embodiment, the channel width is not determined by the field oxide films made by the LOCOS method, but is determined by the patterning.

Note that the process of production is not limited to the process explained above. Various modifications are possible. For example, the patterning of the gate oxide film may be by self-alignment accompanied by the anistropic etching using a nitride (SiN).

According to this process, there are the advantages that one mask can be eliminated and there is no longer any misalignment.

As explained above, according to the present embodiment, since the memory transistor is structured so that a first gate insulating film 4a of a thickness of 8 nm is formed so that the gate oxide film becomes thinner at the central portion in the direction of channel width and so that second gate insulating films 8 and 9 of thicknesses of 40 nm are formed so that it becomes thicker at the two edges, it is possible to suppress fluctuations in the coupling ratio caused by the "bird's beak" phenomenon and possible to ensure stable writing and erasing characteristics.

Note that the present invention can be applied to all non-volatile memories which hold data by accumulation of charges at the floating gates regardless of whether use is made of photoelectrons or FN tunneling for the method of charge injection.

However, the invention is particularly effective in the case of charge transfer by FN tunneling through a gate oxide film. In this case, the charge is injected and drained through the thin film at the center of the channel.

Further, by combining the present invention with an isolated-source type memory cell, the layout becomes extremely easy.

Figure 6:
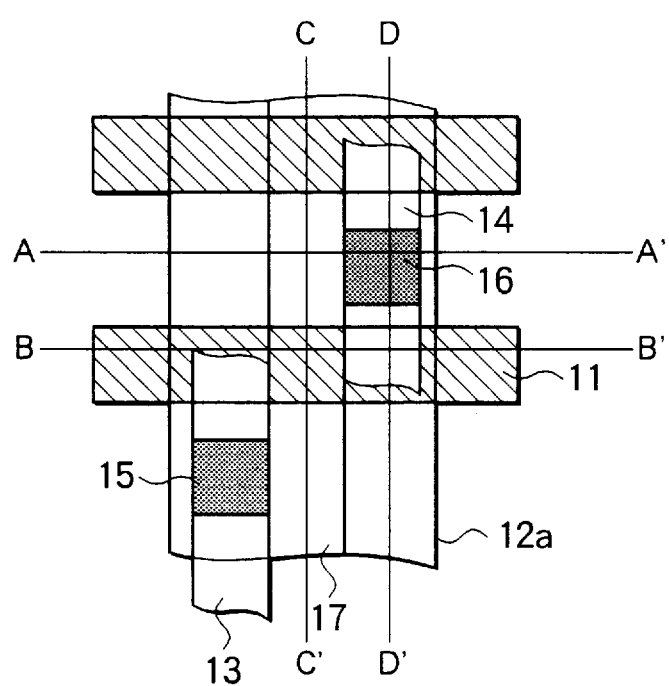
FIG. 6 is a plan view of the patterns for forming a non-volatile memory cell according to an embodiment of the present invention.

FIG. 6 is the view of the layout of an isolated-source type memory cell using the present invention. FIGS. 7A to 7D are cross-sectional views of portions in FIG. 6.

In FIG. 6 and FIGS. 7A t o 7D, 11 denotes a word line, 12 denotes a LOCOS, 22 denotes a diffusion layer, 13 denotes a bit line, 14 denotes a source line, 15 denotes a bit line contact, 16 denotes a source line contact, 16a denotes a contact plug (tungsten or silicon), 17 denotes a thin gate oxide film region, 18 and 19 denote second gate insulating films, 25 denotes a floating gate, 26 denotes a control gate, and 27 denotes an interlayer insulating film.

In FIGS. 5A to 5E, the source-drain diffusion region is formed by ion injection using the control gate 26 and the LOCOS 12 as masks.

Since the thin gate oxide film region 17, which is the main factor determining the coupling ratio, is formed in the shape of a simple stripe, even if misalignment occurs, there is almost no change in the coupling ratio.

Accordingly, it is possible to obtain stable writing and erasing characteristics.

We claim:

1. An electrically programmable, insulated gate field effect transistor memory cell, comprising:

a substrate;

a source region and a drain region formed in the substrate and spaced apart from each other to define a channel region;

a first film extending across a width of the channel region and having a first thickness;

a pair of second films formed at a second thickness over the source region and the drain region, respectively, with each second film having one end connected to the first film on opposite ends of the channel; and a pair of locos formed on the substrate at a third thickness, each locos connected to a respective second film at a second end of the second film opposite the second film's one end;

a floating gate member disposed over the first film, over the pair of second films, and over the pair of locos;

wherein the first thickness is smaller than the second thickness, the second thickness is smaller than the third thickness, and the first film, the second film, and an inner portion of the locos are covered with the floating gate member and wherein the first thickness of the first film is substantially uniform across the channel region.

2. The electrically programmable insulated gate field effect transistor memory cell as set forth in claim 1, wherein the insulating layer comprises a field oxide film.

3. The electrically programmable insulated gate field effect transistor memory cell as set forth in claim 1, wherein the first film comprises a local oxidation of silicon.

4. An electrically programmable, insulated gate field effect transistor memory cell, comprising:

a substrate;

a source region and a drain region formed in the substrate and spaced apart from each other to define a channel region;

a first film extending across a width of the channel region and having a first thickness;

a pair of second films formed at a second thickness over the source region and the drain region, respectively, with each second film having one end connected to the first film on opposite ends of the channel; and a pair of locos formed on the substrate at a third thickness, each locos connected to a respective second film at a second end of the second film opposite the second film's one end;

a floating gate member disposed over the first film, over the pair of second films, and over the pair of locos;

wherein the first thickness is smaller than the second thickness, the second thickness is smaller than the third thickness, and the first film, the second film, and an inner portion of the locos are covered with the floating gate member and wherein the first thickness of the first film is approximately 8 nanometers.

5. An electrically programmable, insulated gate field effect transistor memory cell, comprising:

a substrate;

a source region and a drain region formed in the substrate and spaced apart from each other to define a channel region;

a first film extending across a width of the channel region and having a first thickness;

a pair of second films formed at a second thickness over the source region and the drain region, respectively, with each second film having one end connected to the first film on opposite ends of the channel; and a pair of locos formed on the substrate at a third thickness, each locos connected to a respective second film at a second end of the second film opposite the second film's one end;

a floating gate member disposed over the first film, over the pair of second films, and over the pair of locos;

wherein the first thickness is smaller than the second thickness, the second thickness is smaller than the third thickness, and the first film, the second film, and an inner portion of the locos are covered with the floating gate member and wherein the second thickness of the second film is approximately 40 nanometers.

6. An electrically programmable memory array, comprising:

an insulated gate field effect transistor memory cell having a source region and a drain region formed in a substrate, a channel region formed between the source and drain regions, an insulating layer formed above the source, drain, and channel regions, a floating gate member disposed above the insulating layer and the channel region, and a control gate disposed above the floating gate member;

a word line connected to the control gate;

a source line connected to the source region, the source line extending perpendicular to the word line along the substrate;

a bit line connected to the drain region perpendicular to the word line and parallel to the source line;

wherein the insulating layer comprises:
a first film extending across a width of the channel region and having a first thickness;
a pair of second films formed at a second thickness over the source region and the drain region, respectively, with each second film having one end connected to the first film on opposite ends of the channel; and
a pair of locos formed on the substrate at a third thickness, each locos connected to a respective second film at a second end of the second film opposite the second film's one end;
the first thickness being smaller than the second thickness and the second thickness being smaller than the third thickness and wherein the first thickness of the first film is substantially uniform across the channel region.

7. The programmable memory array as set forth in claim 6, wherein the insulating layer comprises a field oxide film.

8. The programmable memory array as set forth in claim 6, wherein the insulating layer comprises a local oxidation of silicon.

9. An electrically programmable memory array, comprising:

an insulated gate field effect transistor memory cell having a source region and a drain region formed in a substrate, a channel region formed between the source and drain regions, an insulating layer formed above the source, drain, and channel regions, a floating gate member disposed above the insulating layer and the channel region, and a control gate disposed above the floating gate member;

a word line connected to the control gate;

a source line connected to the source region, the source line extending perpendicular to the word line along the substrate;

a bit line connected to the drain region perpendicular to the word line and parallel to the source line;

wherein the insulating layer comprises:
a first film extending across a width of the channel region and having a first thickness;
a pair of second films formed at a second thickness over the source region and the drain region, respectively, with each second film having one end connected to the first film on opposite ends of the channel; and
a pair of locos formed on the substrate at a third thickness, each locos connected to a respective second film at a second end of the second film opposite the second film's one end;
the first thickness being smaller than the second thickness and the second thickness being smaller than the third thickness and wherein the first thickness of the first film is approximately 8 nanometers.

10. An electrically programmable memory array, comprising:

an insulated gate field effect transistor memory cell having a source region and a drain region formed in a substrate, a channel region formed between the source and drain regions, an insulating layer formed above the source, drain, and channel regions, a floating gate member disposed above the insulating layer and the channel region, and a control gate disposed above the floating gate member;

a word line connected to the control gate;

a source line connected to the source region, the source line extending perpendicular to the word line along the substrate;

a bit line connected to the drain region perpendicular to the word line and parallel to the source line;

wherein the insulating layer comprises:
a first film extending across a width of the channel region and having a first thickness;
a pair of second films formed at a second thickness over the source region and the drain region, respectively, with each second film having one end connected to the first film on opposite ends of the channel; and
a pair of locos formed on the substrate at a third thickness, each locos connected to a respective second film at a second end of the second film opposite the second film's one end;
the first thickness being smaller than the second thickness and the second thickness being smaller than the third thickness and wherein the second thickness of the second film is approximately 40 nanometers.

* * * * *

UNITED STATES PATENT AND TRADEMARK OFFICE
CERTIFICATE OF CORRECTION

PATENT NO. : 5,854,502
DATED : December 29, 1998
INVENTOR(S) : Toshiyuki NISHIHARA It is certified that error appears in the above-identified patent and that said Letters Patent is hereby corrected as shown below:

Claim 2 should read as follows:

2. The electrically programmable insulated gate field effect transistor memory cell as set forth in claim 1, wherein the first film comprises a field oxide film.

Signed and Sealed this

Eleventh Day of May, 1999

*Attest:*

Q. TODD DICKINSON

*Attesting Officer*   Acting Commissioner of Patents and Trademarks